(12) United States Patent
Li

(10) Patent No.: US 6,717,814 B2
(45) Date of Patent: Apr. 6, 2004

(54) HEAT DISSIPATION ASSEMBLY

(75) Inventor: Yue-Jun Li, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/290,124

(22) Filed: Nov. 6, 2002

(65) Prior Publication Data
US 2003/0227749 A1 Dec. 11, 2003

(30) Foreign Application Priority Data
Jun. 6, 2002 (TW) ...................... 91208384 U

(51) Int. Cl.⁷ .................................. H05H 7/20
(52) U.S. Cl. ................. 361/704; 24/296; 24/457; 248/505; 248/510; 165/80.3; 165/121; 165/185; 257/718; 257/719; 257/722; 361/697; 361/710; 361/719; 361/720
(58) Field of Search ................ 24/295–296, 457–458; 248/505, 510; 165/80.3, 121, 122, 126, 185; 257/718–719, 722, 726–727; 361/687, 704, 707, 697, 703, 709–710, 715, 719–721, 694–695

(56) References Cited

U.S. PATENT DOCUMENTS

| | | | |
|---|---|---|---|
| 5,448,449 A | * | 9/1995 | Bright et al. ............... 361/704 |
| 5,590,025 A | * | 12/1996 | Clemens ..................... 361/695 |
| 5,771,155 A | * | 6/1998 | Cook ......................... 361/710 |
| 5,808,236 A | * | 9/1998 | Brezina et al. ............. 257/719 |
| 5,973,921 A | * | 10/1999 | Lin .............................. 361/695 |
| 6,181,556 B1 | * | 1/2001 | Allman ....................... 361/690 |
| 6,304,445 B1 | * | 10/2001 | Bollesen ..................... 361/697 |
| 6,415,853 B1 | * | 7/2002 | Tao et al. ................... 165/80.3 |
| 6,496,368 B2 | * | 12/2002 | Jui-Yuan ..................... 361/697 |

* cited by examiner

Primary Examiner—Gregory D. Thompson
(74) Attorney, Agent, or Firm—Wei Te Chung

(57) ABSTRACT

A heat dissipation assembly includes a fan (10), a mounting bracket (20), a clip (30), a heat sink (40), and a mounting frame (50). The fan is mounted to the mounting bracket. The clip is bent from an elongated thread or rod of wire or suitable wirelike material. The clip includes a central horizontal part (302), and a pair of resilient arms (304) extending perpendicularly from opposite ends of the horizontal part. A groove (402) is laterally defined through parallel fins (403) of the heat sink, and receives the horizontal part of the clip therein. The combined fan and mounting bracket is attached to the combined heat sink and clip to form a subassembly. Thus, the clip is secured in the heat sink in advance. The subassembly is received in the mounting frame. Two apertures (504) of the mounting frame respectively engagingly receive two hooks (306) of the resilient arms.

18 Claims, 3 Drawing Sheets

HEAT DISSIPATION ASSEMBLY

BACKGROUND OF THE INVENTION

1. Field of the Invention

The present invention relates to heat dissipation assemblies for heat-generating electronic apparatuses such as those used in computers, and more particularly to a heat dissipation assembly which allows a heat sink and a clip thereof to be combined together in advance.

2. Description of Related Art

A computer central processing unit (CPU) is the core administrator of electrical signals in most contemporary personal computers. Continued development of CPUs has enabled them to perform more and more functions. Heat generated by CPUs has increased commensurately. If excessive heat is generated, this can adversely affect the operational stability of computers. Measures must be taken to efficiently remove the heat from the CPU. Typically, a heat dissipation device having great heat conductivity is mounted on the CPU to remove heat therefrom. A clip is frequently used to firmly attach the heat dissipation device to the CPU, thus achieving greater efficiency of heat dissipation.

A conventional clip for fastening a heat dissipation device to a CPU is an elongate plate that is bent to have a generally M-shaped profile, as shown in U.S. Pat. No. 6,343,015 B1 and Taiwan Patent No. 89216225. The clip defines opposite slots that engagingly receive ears of a socket on which the CPU is mounted. The clip thereby attaches a heat-conducting portion of the heat dissipation device to an upper surface of the CPU. However, such clips are made from plate material, which is bulkier and more expensive than thread, rod or wirelike material. Furthermore, space must be reserved on the heat dissipation device for receiving the clip. A plate-like clip needs more reserved space on the heat sink compared with a thread, rod or wirelike clip. The unduly large reserved space reduces the number of fins that can be configured on the heat dissipation device. This reduces the efficiency of heat dissipation.

Taiwan Patents Nos. 87218994 and 87205513 disclose another kind of clip developed to overcome the above-mentioned problems. The clip is made from an elongated thread or rod of wire or suitable wirelike material. Unfortunately, the clip and the heat dissipation device are independent parts that cannot be attached together in advance. Therefore transportation of the heat dissipation device is inconvenient and unduly costly. Another disadvantage is that during installation of the heat dissipation device on a CPU mounted on a printed circuit board (PCB), the clip must be manually manipulated beside the CPU. Because space around the PCB is generally very limited, it is difficult to manipulate the clip, and there is an appreciable risk of accidentally damaging the CPU. Moreover, all these difficulties render mass production of goods incorporating the heat dissipation device inconvenient, slow and unduly costly. U.S. Pat. Nos. 5,331,507 and 5,615,735 also disclose some wire-like retainer for use with the heat sink on the CPU device.

SUMMARY OF THE INVENTION

Accordingly, an object of the present invention is to provide an inexpensive heat dissipation assembly which allows a heat sink and a clip thereof to be conveniently combined together in advance.

In order to achieve the object set out above, a heat dissipation assembly of the present invention includes a fan, a mounting bracket, a clip, a heat sink and a mounting frame. The mounting bracket includes a top plate, and two sideplates depending from opposite sides of the top plate respectively. The fan is mounted to the mounting bracket. The clip is bent from an elongated thread or rod of wire or suitable wirelike material. The clip includes a central horizontal part, and a pair of resilient arms extending perpendicularly from opposite ends of the horizontal part respectively. A hook extends inwardly from a top of each resilient arm. A groove is laterally defined through the heat sink fins, and receives the horizontal part of the clip therein. The combined fan and mounting bracket is attached to the combined heat sink and clip to form a subassembly. Thus, the clip is secured in the heat sink in advance. The mounting frame is attached to a printed circuit board (PCB), and surrounds an electronic package that is also attached to the PCB. Two spaced protrusions extend upwardly from each of opposite sides of the mounting frame. An aperture is defined in a distal end of each protrusion. The subassembly is received in the mounting frame, with the heat sink contacting the electronic package. Two of the apertures of the mounting frame respectively engagingly receive the hooks of the clip. Thus, the heat dissipation assembly is fully assembled.

Other objects, advantages and novel features of the present invention will become more apparent from the following detailed description when taken in conjunction with the accompanying drawings, in which:

DETAILED DESCRIPTION OF THE INVENTION

Figure 1:
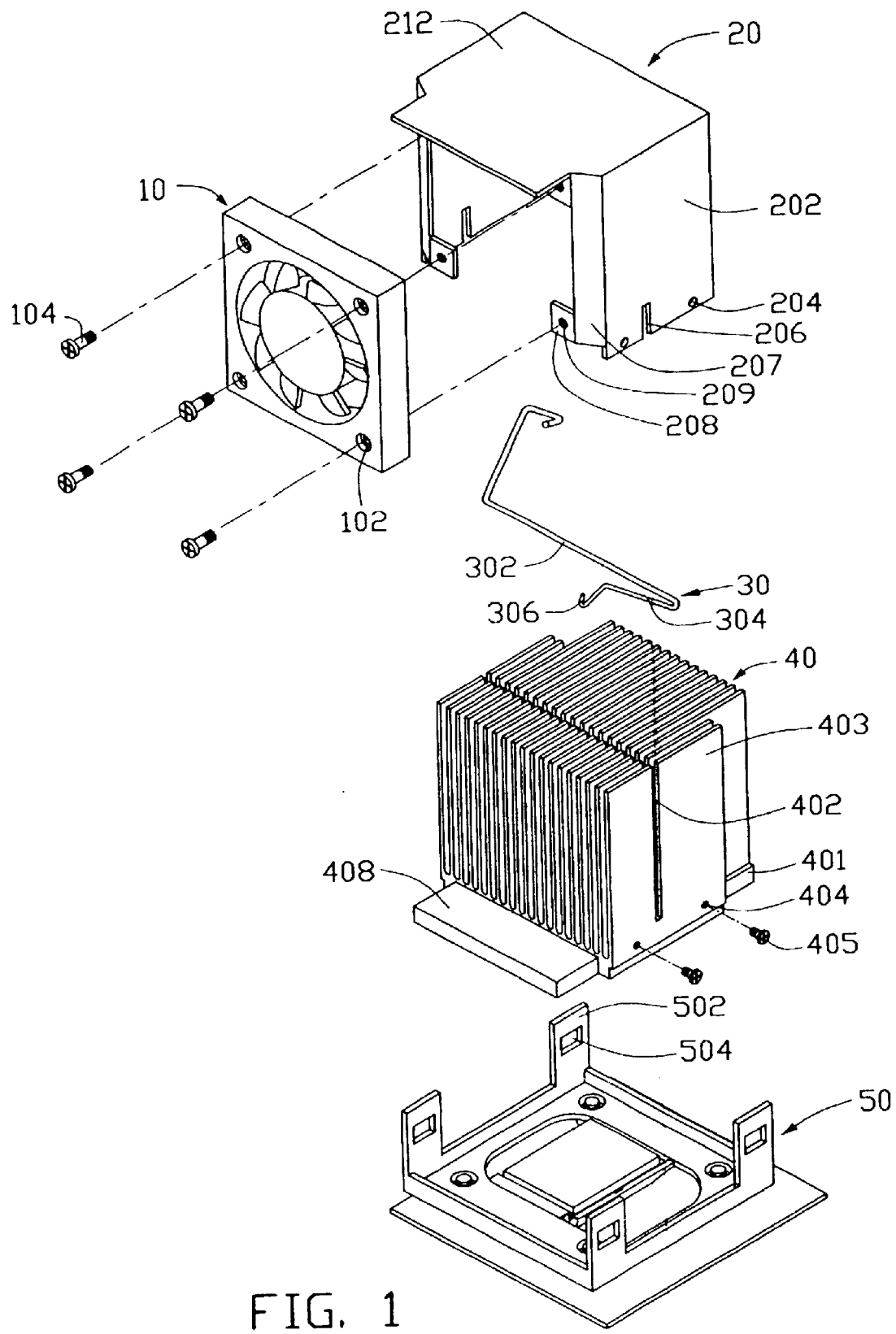
FIG. 1 is an exploded isometric view of a heat dissipation assembly in accordance with the present invention, together with a CPU mounted on a PCB.

Reference will now be made to the drawing figures to describe the preferred embodiment of the present invention in detail.

Referring to FIG. 1, a heat dissipation assembly in accordance with a preferred embodiment of the present invention includes a fan 10, a mounting bracket 20, a clip 30, a heat sink 40 and a mounting frame 50. The fan 10 is generally parallelepiped. A second through hole 102 is defined in each of four corners of the fan 10, for mounting of the fan 10 to the mounting bracket 20 with four fasteners 104 (described in detail later). The fasteners 104 may comprise bolts, screws, rivets and the like. In the preferred embodiment, the fasteners 104 are bolts 104.

The mounting bracket 20 includes a top plate 212, and two sideplates 202 depending from opposite sides of the top plate 212 respectively. A pair of first through holes 204 is defined in a bottom portion of each sideplate 202. A cutout 206 is defined in the bottom portion of each sideplate 202, between the first through holes 204. A guiding shield 207 extends inwardly and forwardly from a front edge of each sideplate 202. A pair of fixing tabs 208 extends inwardly from top and bottom portions respectively of an inmost longitudinal edge of each guiding shield 207. Each fixing tab 208 defines a second fastening hole 209 therein, corresponding to a respective one of the second through holes 102 of the fan 10.

The clip 30 is bent from an elongated thread or rod of wire or suitable wirelike material. The clip 30 includes a central horizontal part 302, and a pair of resilient arms 304 extending perpendicularly from opposite ends of the horizontal part 302 respectively. The resilient arms 304 extend slightly upwardly from the horizontal part 302 in different directions such that when the clip 30 is viewed from a side elevation, the resilient arms 304 form an angle of approximately 90 degrees therebetween. A hook 306 extends inwardly from a top of each resilient arm 304.

The heat sink 40 includes a chassis or base plate 401, and a plurality of parallel heat sink fins 403 extending upwardly from the chassis 401. A supporting protrusion 408 extends from a front end of the chassis 401, for supporting the fan 10 thereon. A groove 402 is laterally defined through the heat sink fins 403. The groove 402 spans from a top of the heat sink fins 403 to the chassis 401. The groove 402 corresponds to the cutouts 206 of the mounting bracket 20, and is dimensioned to be able to receive the horizontal part 302 of the clip 30. The heat sink fins 403 comprise two outmost heat sink fins 403 at respective opposite sides of the heat sink 40. Two first fastening holes 404 are defined in a bottom portion of each outmost heat sink fin 403, corresponding to a respective two of the first through holes 204 of the mounting bracket 20. Four fasteners 405 are for attaching the mounting bracket 20 to the heat sink 40. The fasteners 405 may comprise screws, bolts, rivets and the like. In the preferred embodiment, the fasteners 405 are screws 405.

The mounting frame 50 is attached to a printed circuit board (PCB, not labeled), and surrounds a rectangular electronic package (not labeled) that is also attached to the PCB. Two spaced protrusions 502 extend upwardly from each of opposite sides of the mounting frame 50. An aperture 504 is defined in a distal end of each protrusion 502, for receiving a corresponding hook 306 of the clip 30.

Figure 2:
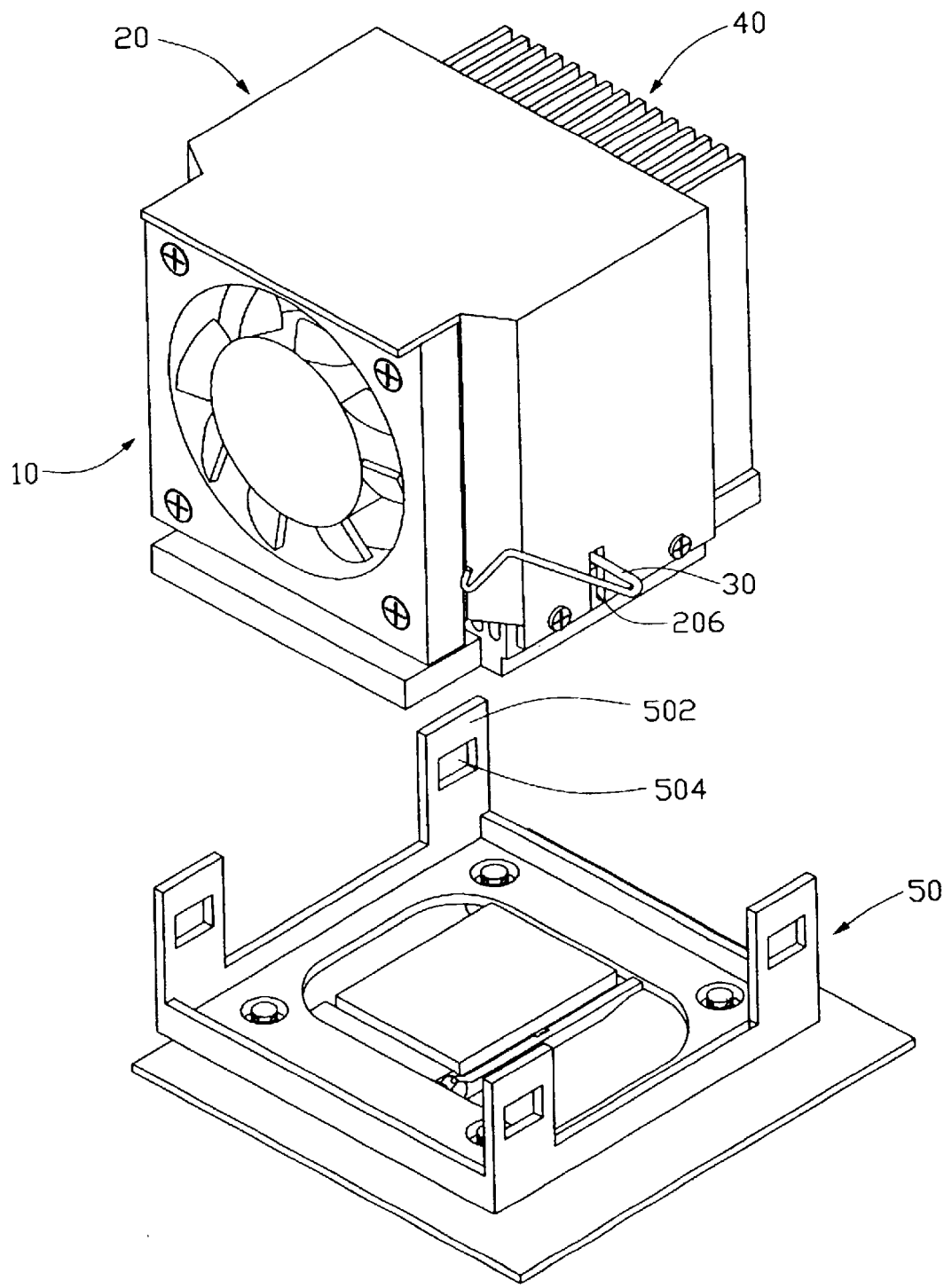
FIG. 2 is an enlarged partly assembled view of FIG. 1, showing a clip and a heat sink of the heat dissipation assembly combined together in advance.
Figure 3:
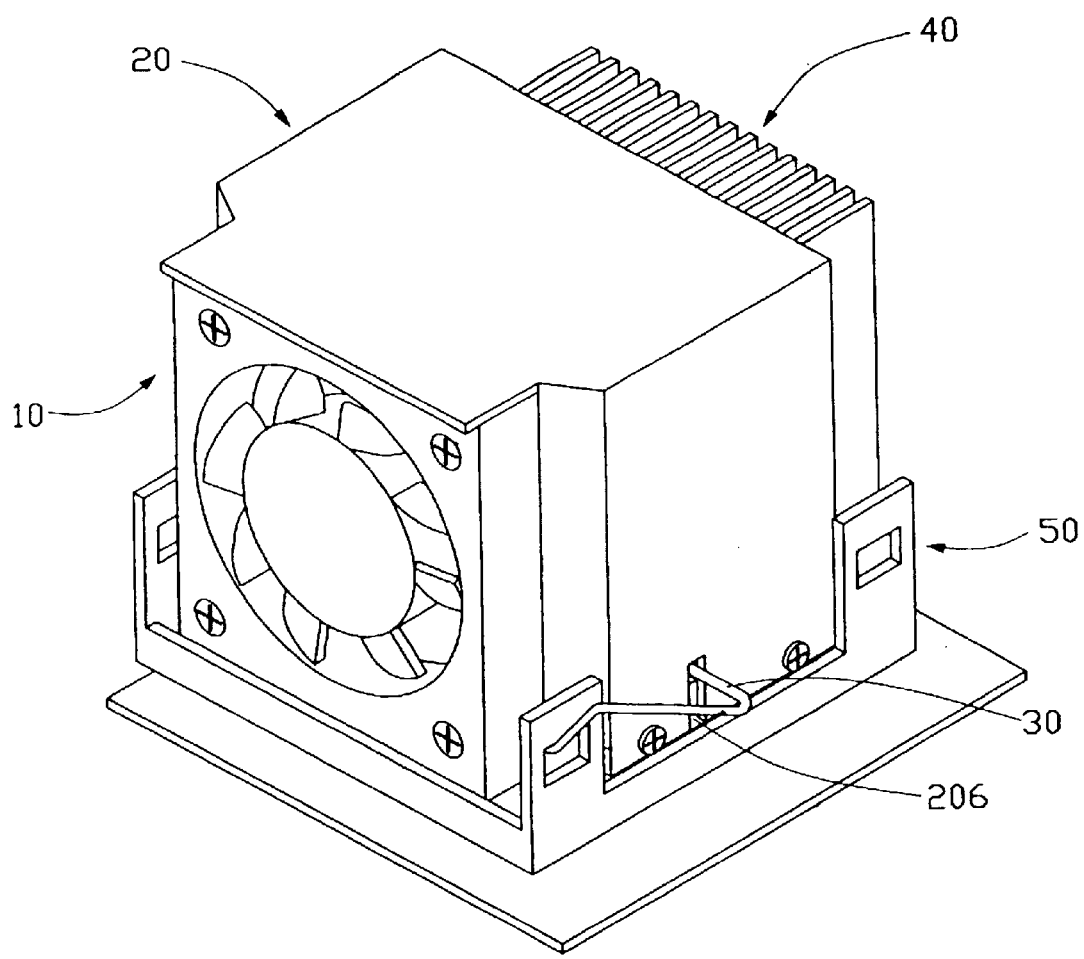
FIG. 3 is an enlarged fully assembled view of FIG. 1.

Referring to FIGS. 2–3, in assembly, the fan 10 is placed against the fixing tabs 208 of the mounting bracket 20. The second through holes 102 of the fan 10 are aligned with the second fastening holes 209 of the mounting bracket 20. The fasteners 104 are extended through the second through holes 102 and engaged in the second fastening holes 209, thereby mounting the fan 10 to the mounting bracket 20. The horizontal part 302 of the clip 30 is placed in the groove 402 of the heat sink 40. The resilient arms 304 of the clip 30 are disposed outside respective outmost heat sink fins 403 of the heat sink 40. The combined fan 10 and mounting bracket 20 is placed on the heat sink 40. The fan 10 is supported on the supporting protrusion 408 of the heat sink 40. The cutouts 206 are aligned with the groove 402, and accordingly receive the horizontal part 302 of the clip 30. The resilient arms 304 are disposed outside of respective sideplates 202 of the mounting bracket 20. The first through holes 204 of the mounting bracket 20 are aligned with the first fastening holes 404 of the heat sink 40. The fasteners 405 are extended through the first through holes 204 and engaged in the first fastening holes 404, thereby attaching the combined fan 10 and mounting bracket 20 to the combined heat sink 40 and clip 30 to form a subassembly. Thus, the clip 30 is secured in the heat sink 40 in advance.

The subassembly is placed in the mounting frame 50, with the heat sink 40 contacting the electronic package (not labeled). The resilient arms 304 of the clip 30 are depressed at the same time, and the hooks 306 of the resilient arms 304 are respectively engaged in two corresponding apertures 504 of the mounting frame 50. Thus, the heat dissipation assembly is fully assembled.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
    a heat sink comprising a chassis and a plurality of fins arranged on the chassis, a groove being defined through the fins;
    a clip comprising a horizontal part received in the groove, and a pair of resilient arms extending from opposite ends of the horizontal part;
    a mounting bracket attached to the heat sink and comprising a top plate and two sideplates depending from the top plate;
    a fan mounted on the mounting bracket; and
    a mounting frame comprising a plurality of apertures, wherein when the mounting frame receives the heat sink, the apertures of the mounting frame can receive the resilient arms of the clip, whereby the heat sink can compactly contact a heat-generating device located at the mounting frame.

2. The heat dissipation assembly as recited in claim 1, wherein the fins are parallel to each other, and extend upwardly from the chassis of the heat sink.

3. The heat dissipation assembly as recited in claim 2, wherein the groove is laterally defined through the fins upwardly from the chassis.

4. The heat dissipation assembly as recited in claim 1, wherein the clip is bent from an elongated thread or rod of wire or suitable wirelike material.

5. The heat dissipation assembly as recited in claim 4, wherein the resilient arms extend substantially perpendicularly from the opposite ends of the horizontal part.

6. The heat dissipation assembly as recited in claim 5, wherein a hook is formed at an end of each of the resilient arms.

7. The heat dissipation assembly as recited in claim 1, wherein a cutout is defined in each of the sideplates of the mounting bracket.

8. The heat dissipation assembly as recited in claim 7, wherein the cutouts of the mounting bracket cooperate with the groove of the heat sink to receive the clip therein.

9. The heat dissipation assembly as recited in claim 1, wherein each of the sideplates of the mounting bracket defines at least one first through hole therein, each of two outmost fins of the heat sink defines at least one first fastening hole therein, and at least two fasteners are extended through the first through holes and engaged in the first fastening holes to attach the mounting bracket to the heat sink.

10. The heat dissipation assembly as recited in claim 1, wherein a guiding shield is arranged inwardly from each of the sideplates of the mounting bracket.

11. The heat dissipation assembly as recited in claim 10, wherein a side of each of the guiding shields comprises at least one fixing tab, and a second fastening hole is defined in each of the fixing tabs.

12. The heat dissipation assembly as recited in claim 1, wherein two spaced protrusions extend upwardly from each of opposite sides of the mounting frame, and the apertures are defined in distal ends of the protrusions.

13. The heat dissipation assembly as recited in claim 11, wherein the fan is substantially parallelepiped, at least two second through holes are respectively defined in corners of the fan, and at least two fasteners are extended through the second through holes and engaged in the second fastening holes of the guiding shields to attach the fan to the mounting bracket.

14. A heat sink assembly comprising:
- a heat sink including a base plate with a plurality of juxtaposed upward fins extending in a lengthwise direction;
- a groove formed in said heat sink and extending through said fins in a transverse direction perpendicular to said lengthwise direction;
- a bracket covering at least partially said heat sink;
- a fan attached to the bracket and located at one lengthwise end of the heat sink to blow air along said lengthwise direction among said fins; and
- a retainer received in said groove and downwardly pressing the base plate.

15. The assembly as recited in claim 14, wherein said bracket defines cutouts through which two ends of the retainer extend.

16. The assembly as recited in claim 15, wherein said heat sink is surrounded by a mounting frame, and said two ends of the retainer is latched thereto.

17. The assembly as recited in claim 14, wherein said retainer is a wire like clip.

18. A heat sink assembly comprising:
- a printed circuit board;
- a mounting frame seated upon said printed circuit board;
- a heat sink surrounded by said mounting frame, said heat sink including a base plate with a plurality of parallel fins extending along a lengthwise direction thereof;
- a groove extending through said fins in a transverse direction perpendicular to said lengthwise direction;
- a fan located around one lengthwise end of said heat sink to blow air along said lengthwise direction among fins; and
- a retainer received in said groove with two opposite ends releasably latched to the mounting frame so as to downwardly press the base plate.

* * * * *